US009935353B2

(12) United States Patent
Ouyang et al.

(10) Patent No.: US 9,935,353 B2
(45) Date of Patent: Apr. 3, 2018

(54) PRINTED CIRCUIT BOARD HAVING A SIGNAL CONDUCTOR DISPOSED ADJACENT ONE OR MORE TRENCHES FILLED WITH A LOW-LOSS AMBIENT MEDIUM

(71) Applicant: Intel Corporation, Santa Clara, CA (US)

(72) Inventors: Gong Ouyang, Olympia, WA (US); Shaowu Huang, Seattle, WA (US); Kai Xiao, University Place, WA (US)

(73) Assignee: Intel Corporation, Santa Clara, CA (US)

( * ) Notice: Subject to any disclaimer, the term of this patent is extended or adjusted under 35 U.S.C. 154(b) by 69 days.

(21) Appl. No.: 14/862,159

(22) Filed: Sep. 23, 2015

(65) Prior Publication Data

US 2017/0086288 A1 Mar. 23, 2017

(51) Int. Cl.
*H01P 3/08* (2006.01)
*H01P 11/00* (2006.01)
*H01P 3/04* (2006.01)
*H05K 1/02* (2006.01)

(52) U.S. Cl.
CPC ............ *H01P 3/081* (2013.01); *H01P 3/04* (2013.01); *H01P 11/003* (2013.01); *H05K 1/024* (2013.01); *H05K 1/0243* (2013.01); *H05K 1/0245* (2013.01); *H05K 2201/09036* (2013.01); *H05K 2201/09872* (2013.01)

(58) Field of Classification Search
CPC .. H01P 3/08; H01P 3/081; H01P 3/082; H01P 3/04; H01P 3/006; H01P 3/026; H05K 1/0245; H04B 7/18515

USPC ............................................ 333/1, 4, 5, 238
See application file for complete search history.

(56) References Cited

U.S. PATENT DOCUMENTS

| 5,276,414 A * | 1/1994 | Fujimoto et al. ......... H01P 1/30 257/788 |
| 5,426,399 A * | 6/1995 | Matsubayashi et al. .................... H01B 7/0861 174/117 FF |
| 6,444,922 B1 | 9/2002 | Kwong |
| 7,659,790 B2 * | 2/2010 | Shaul et al. ............ H01P 3/003 333/1 |
| 2002/0050606 A1 | 5/2002 | Buerger, Jr. |
| 2003/0036349 A1 * | 2/2003 | Wu et al. ........... H04B 7/18515 455/12.1 |

(Continued)

*Primary Examiner* — Benny Lee
(74) *Attorney, Agent, or Firm* — Schwabe, Williamson & Wyatt, P.C.

(57) ABSTRACT

A conductor in a laminar structure, such as a printed circuit board or thin-film stack, is closely flanked by at least one open trench filled with an ambient medium (e.g., air, another gas, vacuum) of a lower dielectric loss than the conductor's surrounding dielectric. The trench may be made by any suitably precise method such as laser scribing, chemical etching or mechanical displacement. A thin layer of dielectric may be left on the sides of the conductor to prevent oxidation or other reactions that may reduce conductivity. When the conductor carries a signal, part of an electric and/or magnetic field that would ordinarily travel through the surrounding dielectric encounters the low-loss ambient medium (e.g. air) in the trench. The effective dielectric loss surrounding the conductor is lowered, reducing signal attenuation and crosstalk, particularly at high frequencies.

18 Claims, 9 Drawing Sheets

(56) References Cited

U.S. PATENT DOCUMENTS

| | | | |
|---|---|---|---|
| 2004/0124956 A1* | 7/2004 | Ahn et al. | H01L 23/66 |
| | | | 333/238 |
| 2007/0164438 A1 | 7/2007 | Sir et al. | |
| 2014/0264573 A1 | 9/2014 | Kocon et al. | |
| 2015/0303177 A1 | 10/2015 | Blanchard | |
| 2017/0187451 A1* | 6/2017 | Ralph et al. | H05K 1/0243 |

* cited by examiner

PRINTED CIRCUIT BOARD HAVING A SIGNAL CONDUCTOR DISPOSED ADJACENT ONE OR MORE TRENCHES FILLED WITH A LOW-LOSS AMBIENT MEDIUM

FIELD

Related fields include circuits with laminar construction, and more particularly dielectric loss reduction in printed circuit board (PCB) and package interconnects formed from a conductive layer in a laminate structure, including without limitation masking, etching, sputter deposition, and electroplating.

BACKGROUND

Circuits fabricated as laminates (either printed circuit boards or thin-film stacks on semiconductor substrates) often include connective conductors formed from one or more patterned conductive layers. The conductors may carry signals, provide power, or act as ground or other reference lines. (In this document, "ground" will serve as a generic shorthand for any reference conductor). Conductors with different functions may be fabricated on different layers; the "signal plane," the "power plane," and the "ground plane" may sometimes be separate from each other. Alternatively, combinations of signal lines, power lines, and ground lines may be coplanar or formed in the same layer. Signal-carrying conductors may be single lines, differential pairs such as microstrip, or single or paired lines with coplanar parallel ground lines such as coplanar waveguides. Ground planes may be unpatterned conductive layers as in some printed circuit boards (PCBs).

Two ongoing trends in electronics manufacturing are (1) higher data rate, e.g., fabric or Peripheral Component Interconnect Express (PCIe) applications and (2) higher component density, which entails a corresponding increase in the density of signal lines and other interconnects. As data rates increase, the signaling performance degrades due to the frequency dependent loss of the presently used copper conductors and surrounding dielectrics. Thus, it becomes more and more important to control and reduce the dielectric loss in high speed digital system designs. This is particularly critical for longer routing lengths in PCB or package. The dielectric loss becomes a dominant factor in high speed signaling since it dominates the total loss for frequency in GHz range. Through producing air-filled trenches along the conductor traces, the dielectric loss can be significantly reduced. Because air is lossless (dielectric constant=1, loss tangent=0), the total dielectric loss caused by the mixed medium (dielectric+air) surrounding the trace is reduced. Other approaches have included, without limitation, using a thicker layer of copper for the signal plane to reduce the conductor loss; using special low-loss dielectric as the substrate or as the fill layer around the signal conductors; or adding another conductive plane. All these add significant extra production cost, and/or are not effective in reducing the total PCB channel loss. For example, when there are only a few (e.g., the longest and thinnest) signal traces that do not easily meet the loss target, using a more expensive material or design throughout the entire package may not be cost-effective.

A need exists for a cost-effective solution to overcome the difficulty of meeting link loss targets and to improve the signal integrity performance of PCB microstrips. The present disclosure addresses these needs.

DETAILED DESCRIPTION OF THE INVENTION

Figure 1A:
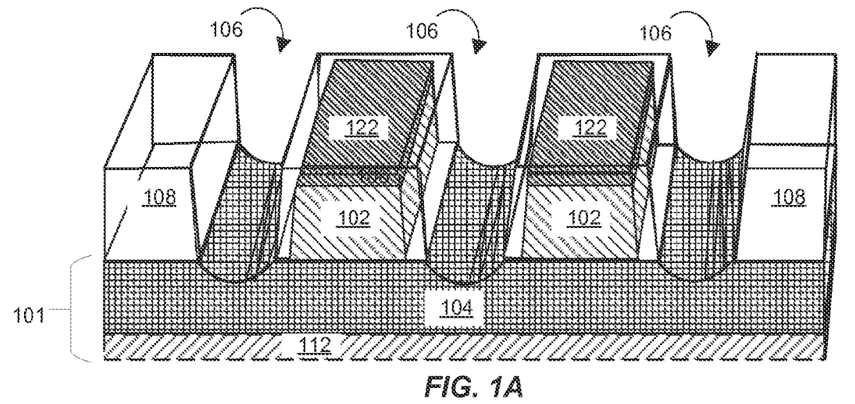
FIGS. 1A-1C schematically illustrate an example of a microstrip fabricated on a printed circuit board (PCB) with open trenches.
Figure 1B:
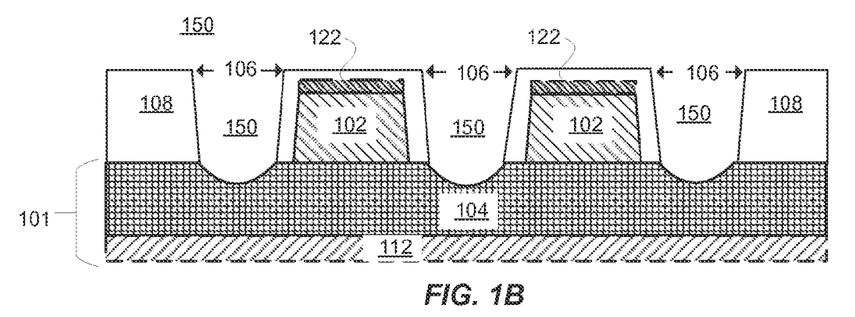
Figure 1C:
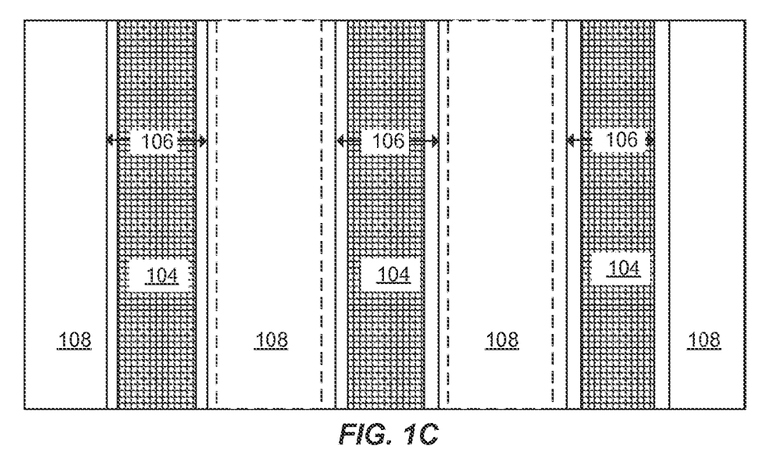

FIGS. 1A-1C schematically illustrate an example of a microstrip fabricated on a printed circuit board (PCB) with open trenches. FIG. 1A is a perspective view, FIG. 1B is a front view, and FIG. 1C is a top view of the section of the PCB. The following discussion refers to all three figures.

Substrate 101 (FIGS. 1A and 1B) of the PCB includes composite layer 104 and optionally ground backing layer 112 (FIGS. 1A and 1B). All the conductor embodiments described herein may be used with or without the ground backing layer 112. Composite layer 104 is an insulating material situated similarly to an interlayer dielectric (ILD) in thin-film circuits; that is, as a blanket insulating layer providing a base surface for the fabrication of components and/or their interconnections. On double-sided PCBs, the ground backing layer 112 may be positioned near the center of the stack, between two composite layers 104. Conductive traces 102 (FIGS. 1A and 1B) (hereinafter "conductors") are formed over the surface of composite layer 104. For example, the conductors may be fabricated by laminating a copper sheet onto a top surface of the composite layer, then etching away the parts of the copper sheet that are outside the paths of the conductors. In this example, conductors 102 are topped with a plating layer 122 (FIGS. 1A and 1B). For instance, conductors 102 may be copper and plating 122 may be an alloy, such as copper with zinc. Plating 122 may be added before or after etching. Conductors 102 and plating 122 are buried in a surrounding dielectric 108. Surrounding dielectric 108 is analogous to the fill dielectric in thin-film circuits.

Open trenches 106 have been made beside conductors 102. A low-dielectric-loss ambient medium 150 is permitted to enter and fill trenches 106. For example, the ambient medium 150 (FIG. 1B) may be air, another gas such as nitrogen or argon (e.g., for an application requiring a non-oxidizing atmosphere), or vacuum (e.g., for a space-based application). The trenches may be made by a laser scriber, mechanical action on dielectric layers that may be optionally softened by heating, or any other known etching procedure compatible with the materials.

In some embodiments, a thin layer of surrounding dielectric 108 is left to cover conductor 102 and, if present, plating 122. This thin layer shields conductor 102, plating 122, or both from exposure to a potentially corroding ambient medium 150; for example, to prevent copper from being oxidized by air. However, there may be embodiments where corrosion is not an issue; for example, if the ambient medium 150 is substantially free of oxygen (e.g., less than 0.01 ppm) or if conductor 102 and, if present, plating 122 are inert metals. In those embodiments, conductor 102 and, if present, plating 122 need not be sealed on all but the bottom side by surrounding dielectric 108. Plating 122 may be exposed on the top of conductor 102, or the sides of conductor 102 may be exposed. Preferably, if the surrounding dielectric 108 is to be removed from the sides of conductor 102, the scribing or etching procedure is sufficiently controllable that it does not take enough conductive material off the sides of conductor 102 to change the impedance of conductor 102 in an inconsistent or unpredictable way. Optionally, open trenches 106 may extend past the original top surface of the substrate 101 and into the bulk of composite layer 104 as illustrated.

Because only a thin layer, if any at all, of surrounding dielectric 108 still surrounds conductors 102, electric or magnetic fields created by signals traveling in conductors 102 experience the ambient medium 150 as part of a compound "surrounding dielectric." Air, nitrogen, argon, and vacuum produce vanishingly small dielectric losses. The compound-surrounding-dielectric effect may be expected to grow stronger as the frequency increases, as more of the electromagnetic energy generated by the signal propagates through low-loss medium 150 compared to the energy propagating through the etched or surrounding dielectric.

Figure 2A:
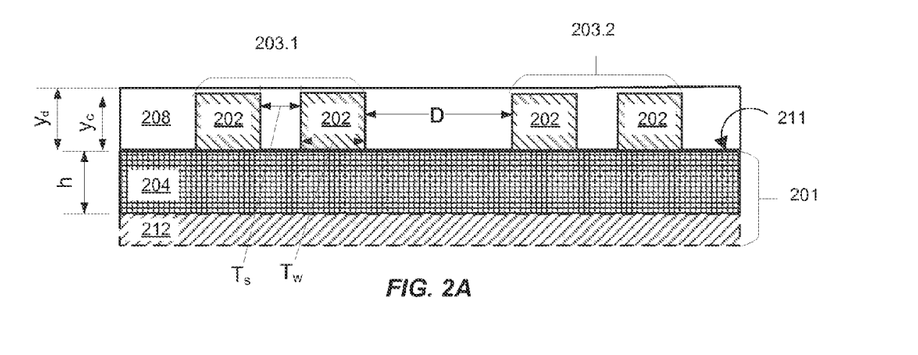
FIGS. 2A-2C schematically illustrate two differential microstrip pairs with and without open trenches.
Figure 2B:
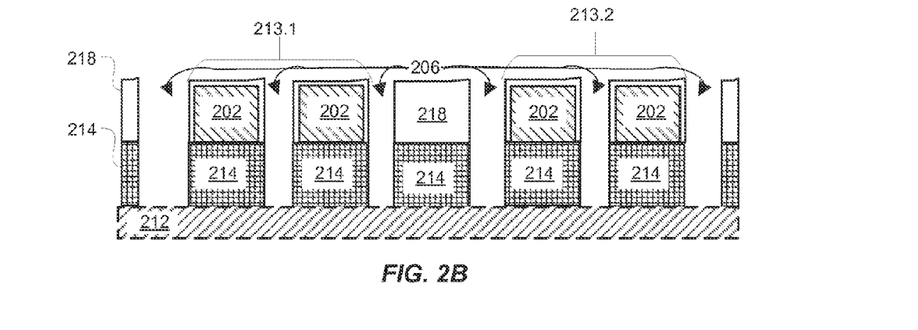
Figure 2C:
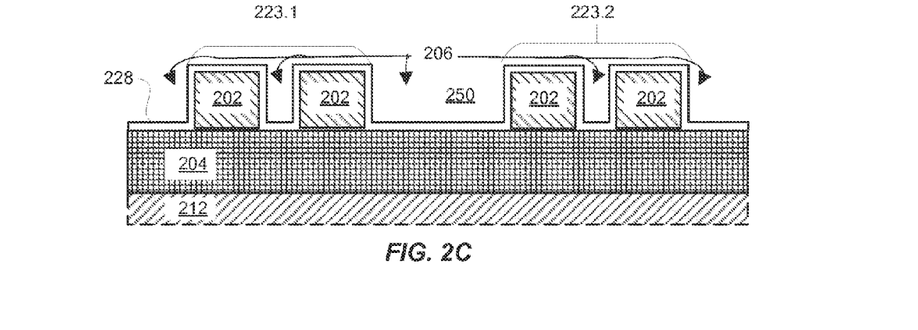

FIGS. 2A-2C schematically illustrate two differential microstrip pairs with and without open trenches.

FIG. 2A illustrates a first stage in constructing a conductor layer with trenches: namely, constructing a conventional, trenchless interconnect layer. A first differential microstrip pair 203.1 and a second differential microstrip pair 203.2 are fabricated on a surface 211 of a composite or ILD layer 204 on substrate 201. Ground backing layer 212 is optional. In addition, other layers and structures may be present under composite or ILD layer 204, but are not shown because they do not affect the loss-reducing properties of open trenches. Surrounding dielectric 208 completely covers differential microstrip pair 203.1 and 203.2. Some dimensional variables relevant to discussing modeling and test results are: inter-pair distance D between differential microstrip pair 203.1 and differential microstrip pair 203.2, the width $T_w$ of conductors 202, composite or thickness H of ILD 204, thickness $Y_c$ of conductors 202, thickness $Y_d$ of surrounding dielectric 208, and spacing $T_s$ between two conductors 202 of the same differential microstrip pair 203.1 or 203.2.

FIG. 2B illustrates the second stage in constructing a conductor layer with trenches: namely, making the trenches. In this example, trenches 206 have created separated islands of both the surrounding dielectric 218 and the underlying composite or ILD layer 214. Ground backing layer 212 acts as the support layer in this illustration, but any other suitable underlying layer could be substituted. Note that trenches 206 between the two isolated differential microstrip pair 213.1 and 213.2 that may include conductors 202 are separated by a conductor-less dielectric island of the etched-away surrounding dielectric 218 and ILD 214. This may be convenient in some embodiments, e.g., using a scriber beam or mechanical scriber a fixed width.

FIG. 2C illustrates an alternative approach. After forming the conductors 202, surrounding dielectric 228 is applied as a thin conformal coating rather than a relatively thick blanket coating such as 208 in FIG. 2A. For example, a conformal coating may be applied by atomic layer deposition (ALD) or other forms of physical or chemical vapor deposition. Solder mask based on various materials is a common form of coating in PCBs. The extra process step of forming trenches is obviated because the existing "valleys" between conductors 202 are thinly lined, rather than filled, by the conformal coating. As with trenches formed by scribing or etching in a blanket coating, the end result is that conductors 202 have a thin solid dielectric coating 228 separating them from a space filled by ambient medium 250. Center valley 206 between the two differential microstrip pairs 223.1 and 223.2 spans the entire width D (see FIG. 2A) without requiring a scriber to adjust its "blade" width or make multiple passes. If the spacing between the two microstrips of the pair 223.1 and 223.2 is small, the thickness of the coating between the two microstrips in one pair may not be thin and may be similar to the blanket coating case. In this case, the trenches may still be made by laser scribing or other methods to reduce microstrip dielectric loss. FIG. 2C may include ILD layer 204 and ground backing layer 212.

Figure 3:
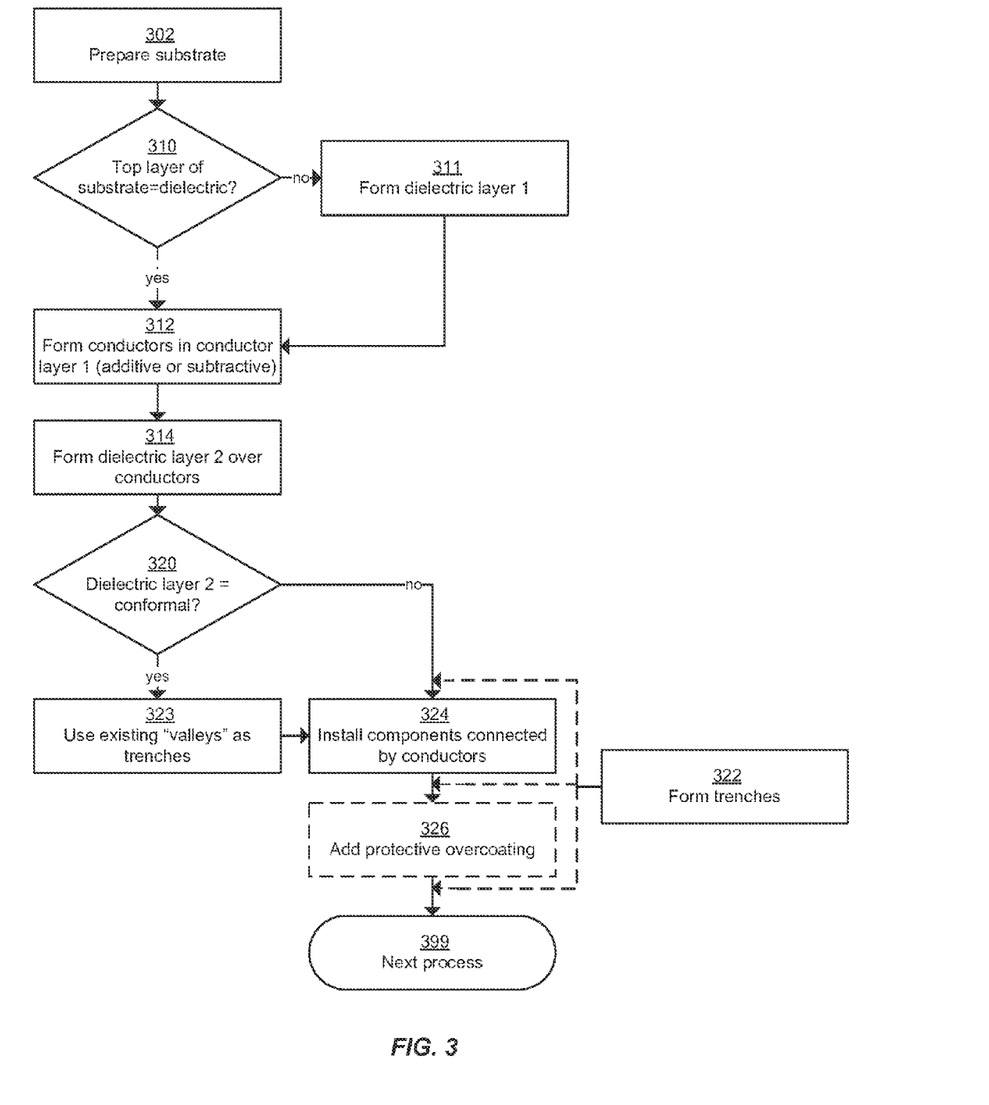
FIG. 3 is a flowchart of a process of making an interconnect layer with loss-reducing trenches in a laminate-type circuit.

FIG. 3 is a flowchart of a process of making an interconnect layer with loss-reducing trenches in a laminate-type circuit. Initially, the substrate is prepared at step 302. Preparation 302 may include cleaning, degassing, or formation of layers or structures that may underlie the interconnect layer. At decision 310, if the top substrate layer is not a dielectric (i.e. No), then at step 311 a first dielectric layer, such as a composite layer or an ILD, is formed over the top substrate layer by any suitable method before beginning step 312 of conductor formation. However, if the top layer is already dielectric (i.e. Yes), the process may immediately advance to step 312, formation of the conductors on the dielectric surface by an additive (e.g., spray-on or selective plating) or subtractive method (e.g., scribing or etching a homogeneously created conductive layer.

At step 314, a second, surrounding dielectric layer is formed over the conductors as well as over any exposed composite-layer/ILD surfaces. The surrounding dielectric layer may be either a blanket layer as in FIG. 2A or a conformal coating as in FIG. 2C. At decision 320, if the surrounding dielectric is a conformal layer (i.e Yes), the existing thinly-lined valleys, which may be referred to as "valleys" in FIG. 3, between the coated conductors may be used as trenches in step 323. Subsequently, step 324 may be started. Alternatively, trenches may be formed at step 322 at any of a number of different points in the process.

Trench formation at step 322 may include laser ablation, photodisruption, laser/thermal cutting, mechanical displacement with or without heating the substrate to soften it, plasma or reactive-ion etching, or wet chemical etching. Those of ordinary skill in the art will be aware of which processes are suitable for the materials and scale of particular circuits of interest.

In some embodiments, trench formation 322 may be the very next step, before additional components are installed or formed during step 324. In step 324, which may be reached by a "No" decision at step 320, components such as processors, transmitters, receivers, volatile or nonvolatile memory components, sensors, or input/output connectors are added to the board, or other laminated-circuit substrate.

The components installed in step 324 may be connected by the conductors immediately below them. Alternatively, the components installed in step 324 may be connected by another interconnect layer to be installed above them, while the interconnect layer below them connects components located in an even lower layer. Combinations are also possible where the interconnect layer connect to one or more components below it with one or more components above it.

In some embodiments, trench formation 322 may follow component installation 324 and precedes an optional protective overcoating step 326. Some PCBs and other laminated circuits are given a thick overcoating, often of polymer or elastomer, to protect the fabricated circuit from damage during transport, storage, or operation. For example, if the protective overcoating is intended to be removed before the laminated circuit is operated or installed in a parent device, the trenches may be formed in step 322 and then covered with the overcoating, along with the components and conductors, in step 326. The trenches will then be exposed and filled with ambient medium (air, other gas, or vacuum) when the overcoating is removed for installation or operation of the circuit. Alternatively, the overcoating may be viscous and cohesive enough to cover the openings of the trenches but not sink into them, so air (or another gas) is trapped inside. Optionally, a few small vents may pierce the overcoating to equalize pressure or draw the gas out of the covered trenches.

In some embodiments, the trench formation 322 may follow protective overcoating step 326 and precede to next process 399. For example, if the protective overcoating is intended to be permanent, the trenches may be formed through the in situ protective overcoating to allow ambient medium to circulate through it. If the materials exposed by trench formation step 322 are not likely to be harmed by contact with air during storage or shipping, the trenches may be left bare after formation in step 322. If the materials exposed in the trench walls or bottom still need further protection, a thin layer of low-viscosity, low-cohesion topcoating may be applied after trench formation step 322 through the thick protective layer applied in step 326. Next step 399 may be, for example, breaking apart multiple independent circuits on a large substrate, packaging the circuit, or connecting it to other circuits.

FIGS. 4A-4D are data charts based on model results. A theoretical model has been constructed to compare performance aspects of differential microstrip pairs on a conventional trenchless PCB (e.g., as in FIG. 2A) with differential microstrip pairs on a PCB that is identical except for having trenches (e.g., as in FIG. 2B). As in FIGS. 2A and 2B, the model considered two neighboring differential microstrip pairs so that crosstalk could be included in the calculations. Referring to dimensions illustrated in FIGS. 2A and 2B, the parameters of the model included:

Thickness "h" of the composite core layer 204=0.101 mm (0.004");

Thickness "$y_d$" of solder-mask=0.086 mm (0.0034"), thickness "$y_c$" of conductive traces=0.079 mm (0.0031");

Width "$T_w$" of individual traces=0.152 mm (0.006"), trace spacing "$T_s$" inside each differential pair=0.14 mm (0.0055");

Spacing "D" between one differential pair and the other=0.622 mm (0.0245") ~6 h.

Figure 4A:
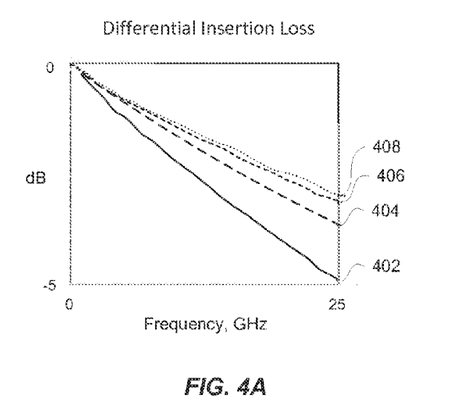
FIGS. 4A-4D are data charts based on model results.

FIG. 4A compares the calculations of differential insertion loss (i.e. in dB) vs. frequency (in GHz) for a 51 mm (2") of microstrip length for a trenchless PCB with those of PCBs with various trench depths. Curve 402 is the conventional trenchless microstrip. Curve 404 shows the results for a trench depth of 0.051 mm (0.002"). Curve 406 shows the results for a trench depth of 0.102 mm (0.004"). Curve 408 shows the results for a trench depth of 0.178 mm (0.007") trenches. The DC loss is negligible for all the PCBs but the trenchless microstrip (curve 402) has a slope of about −0.2 dB/GHz, while the 0.178 mm deep trenches (curve 408) reduced the slope to about −0.12 dB/GHz, an improvement of about 40%.

Another notable feature of the graph is that a shallow trench has a significant effect, but the gains diminish for deeper trenches. Comparing the trench depths to the layer thicknesses, the shallowest 0.051 mm trenches (curve 404) extend about ⅔ of the way through the solder-mask (surrounding dielectric), which for this model is also ⅔ of the way past the microstrip trace. The 0.102 mm trenches (curve 406) extend all the way through the solder-mask (surrounding dielectric) and into the composite layer to an additional ⅓ of the microstrip trace thickness. The 0.178 mm trenches (curve 408) go further into the composite layer. This suggests that most of the insertion-loss reduction benefit comes from the part of the trench right beside the side of the trace. Continuing to remove material below the level of the bottom of the trace may reduce the insertion loss a little more, but the improvement "tops out" and approaches a constant beyond a threshold distance past the bottom of the trace.

Figure 4B:
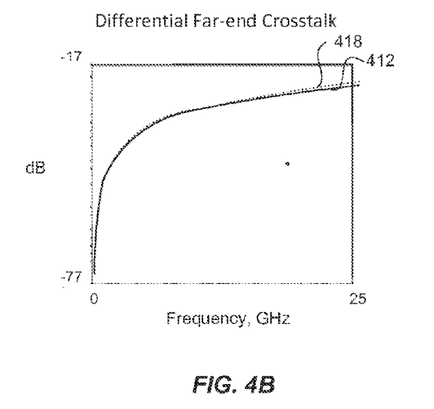

FIG. 4B compares the differential far-end crosstalk (FEXT in dB) vs. frequency (in GHz) of 50.8 mm (2") lengths of the trenchless microstrip (curve 412) and the microstrip with 0.178 mm trenches (curve 418). Up to about 25 GHz, the trenches appear to cause no significant change in the differential FEXT.

Figure 4C:
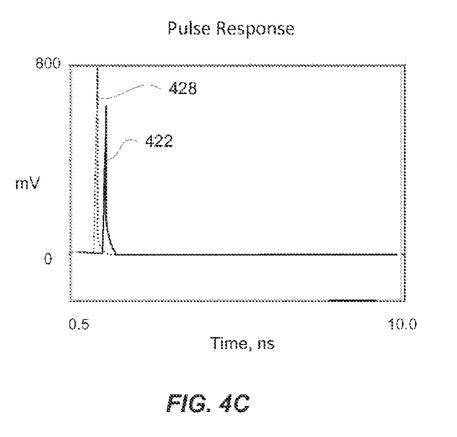

FIG. 4C examines the pulse responses in mV over the time-domain in ns for 254 mm (10") lengths of trenchless microstrip and microstrip with 0.178 mm trenches. A single pulse (Unit Interval=62.5 pS, Data Rate=16 GTs) arrives earlier, and larger in magnitude, through the microstrip with trenches (curve 428) compared to the trenchless microstrip (curve 422). The trenches filled with low-loss air appear to increase the propagation speed of signals, in addition to reducing the dielectric loss and possibly reducing the dispersion (spreading) of short pulses.

Figure 4D:
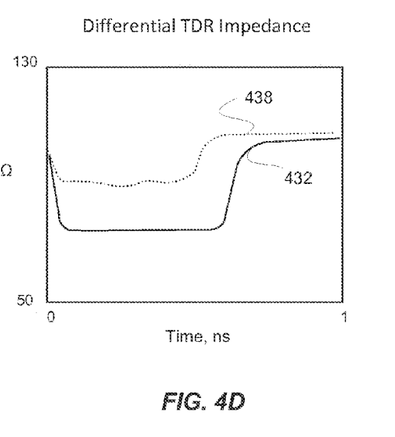

FIG. 4D compares the impedance in Ohms (Ω), measured by time-domain reflectometry (TDR) in ns for 254 mm sections of trenchless microstrip (curve 432) and microstrip with 0.178 mm trenches (curve 438). The TDR graph shows an impedance increase of 15Ω with the trenches. In some designs with target impedances, this impedance increase may need to be offset by an impedance-lowering measure such as widening the traces or narrowing the gap between differentially paired traces.

FIGS. 5A-5E are examples of single traces and the effects of trenches on the electromagnetic fields created by signals traveling along the traces. A single signal trace is the simplest implementation and provides a clear demonstration of the trenches' effect.

Figure 5A:
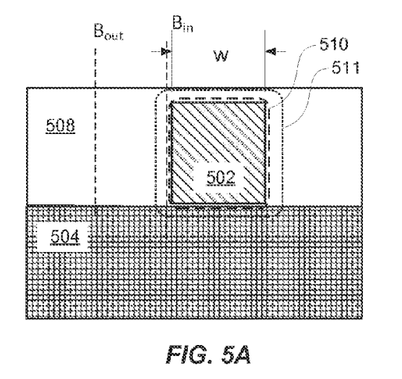
FIGS. 5A-5E are examples of single traces and the effects of trenches on the electromagnetic fields created by signals traveling along the traces.

FIG. 5A schematically illustrates a conductor layer. Conductor 502 of width w is laminated onto composite or ILD 504 and surrounded by dielectric 508 on the top and both sides. A DC current or very low-frequency signal in conductor 502 produces an electromagnetic field with envelope 510, approximately the same size as conductor 502. A high-frequency signal in conductor 502 produces an electromagnetic field with envelope 511, which extends further out from conductor 502; the higher the frequency, the larger the envelope.

In some embodiments, amplitudes of fields with envelopes 510 and 511 may drop exponentially outside the outer surface of conductor 502. For example, envelopes 510 and 511 may mark the full width as half-maximum (FWHM) of the fields, and the fields may extend at a decaying amplitude outside the illustrated envelopes. Any part of the field that travels through a lower-dielectric-loss medium that the surrounding dielectric will reduce the insertion loss of the conductor, but the effect may be more pronounced if a higher-amplitude part of the field (e.g., the part inside the envelope) is directed through the lower-loss medium.

Figure 5B:
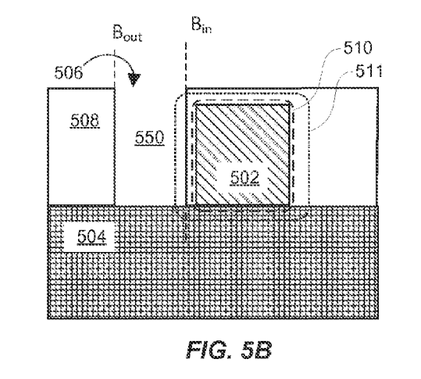

Therefore, the inner boundary $B_{in}$ of a potential trench which may be similar to trench 550 of FIG. 5B is preferably as close to the surface of conductor 502 as possible. A lower limit on the distance of inner trench boundary $B_{in}$ from the nearest edge of conductor 502 may be set to leave a thin layer of the surrounding dielectric 508 between conductor 502 and the ambient medium in the trench if the ambient medium is likely to react with the conductor. Additionally or alternatively, such a limit may be imposed by manufacturing tolerances to avoid inadvertently cutting into conductor 502. A lower limit on outer trench boundary $B_{out}$ may be placed by calculating the expected exponential decay of the amplitude of electromagnetic field envelope 511 at the maximum frequency of interest. For example, $B_{out}$ may be placed where the field at a maximum frequency of interest drops to, for example, 10%, 5%, or 1% of its amplitude at $B_{in}$. A trench spanning a width from the of $B_{in}$ of a first conductor to the $B_{in}$ of a second conductor, where the exponential decay sections of the field envelopes of both conductors are fully contained in the trench, may produce the same loss reduction as two separate trenches that each contain the decay portion of the field envelope of one of the conductors.

FIG. 5B schematically illustrates the effect of a trench from $B_{in}$ to $B_{out}$ and completely through the dielectric 508 in the interconnect layer shown in FIG. 5A. Trench 506 in dielectric 508, which as illustrated reaches the upper surface of composite or ILD 504, is filled with air or another low-loss ambient medium 550. Part of high-frequency envelope 511 is captured by trench 506, but DC/low-frequency envelope 510 is not. Part of the decaying "tail" of the DC/low-frequency field outside envelope 510 may travel through ambient medium 550, but the effect on loss may not be significant. A conductor 502 may be shown.

Figure 5C:
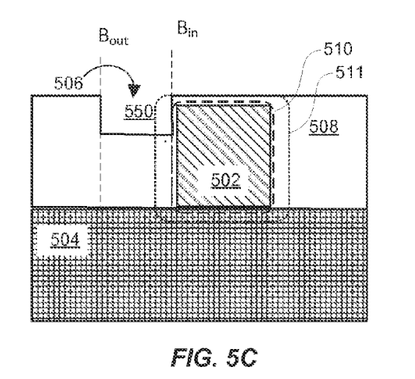

FIG. 5C schematically illustrates the effect of a trench from Bin to Bout but only about one-third of the depth of dielectric 508 in the interconnect layer shown in FIG. 5A. Trench 506 may cut into high-frequency envelope 511, reducing some of the dielectric loss but not as much as the deeper trench in FIG. 5B. DC/low-frequency effects may be small because trench 506 does not intersect envelope 510. A conductor 502, ILD 504 and trench 550 may be shown.

Figure 5D:
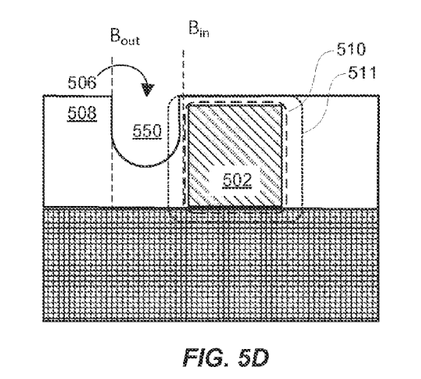

FIG. 5D schematically illustrates the effect of a round-bottomed trench from Bin to Bout, at its lowest point extending about halfway past the conductor 502 through the dielectric 508 in the interconnect layer shown in FIG. 5A. In some types of laminated circuits, flat bottoms and sharp corners on trenches are preferred. However, such features may be difficult to achieve; many etching methods produce round-bottomed trenches. The loss-reducing open trenches described herein are not very sensitive to differences in bottom profile. Trench 506 filled with low-loss ambient medium 550 is round-bottomed. The shape has little effect on the dielectric loss reduction. Trench 506 may intersect high-frequency field envelope 511, reducing more of the dielectric loss than the shallow flat-bottomed trench 506 in FIG. 5C, but less than the deep flat-bottomed trench in FIG. 5B. DC/low-frequency effects may be small because trench 506 does not intersect envelope 510. FIG. 5D may show $B_{in}$ and $B_{out}$ as described elsewhere herein.

Figure 5E:
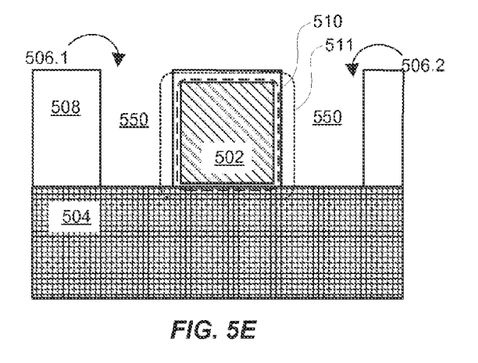

FIG. 5E schematically illustrates the interconnect layer of FIG. 5A with two trenches 506.1 and 506.2, one on each side of conductor 502. Trenches 506.1 and 506.2 intersect opposing portions of high-frequency field envelope 511, so the overall high-frequency insertion loss is reduced more than it would be with only a single trench, all other variables being equal. The same applies to DC/low-frequency envelope 510, though the effects of each of the trenches 506.1 and 506.2 may be small. A conductor 502, ILD 504, dielectric 508, and/or trench 550 may be shown.

FIGS. 6A-6E schematically illustrate planar waveguides with trenches. The following contextual elements are alike in FIGS. 6A-6E: Composite core 604 and optional ground backing layer 612 constitute a substrate 601. One or more conductors 602 are configured to carry signals and are flanked by one or more coplanar ground lines 642. Conductor 602 and coplanar ground lines 642 are buried under dielectric fill layer 608.

Figure 6A:
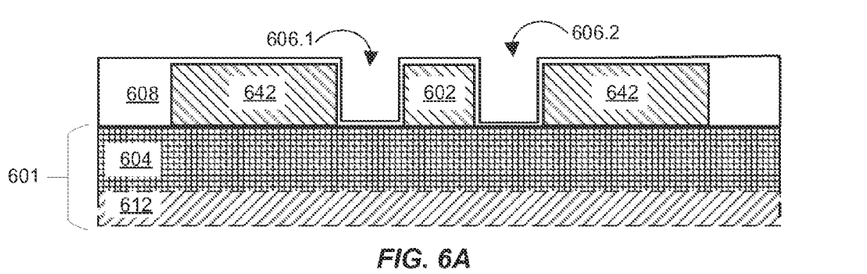
FIGS. 6A-6E schematically illustrate planar waveguides with trenches.

FIG. 6A schematically illustrates a single-ended (i.e., single-trace) planar waveguide on a PCB with trenches added around the signal-carrying conductor. As illustrated, two open trenches 606.1 and 606.2 extend from just outside conductor 602 to just outside the nearest coplanar ground line 642. A thin layer of surrounding dielectric layer 608 protects the sides of conductor 602 and the top surface of composite core 604 in this example. This may be preferable, for example, if the material of composite core 604, as well as that of conductor 602 and coplanar ground line 642, may be vulnerable to an external environment. Alternatively, the trenches 606.1 and 606.2 may have some other depth between zero and the entire thickness of substrate 601 and surrounding dielectric 608. Another independent alternative is to have one wall of each trench 606.1 and 606.2 close to conductor 602 as illustrated, but narrower so is not to reach all the way to coplanar ground line 642.

Figure 6B:
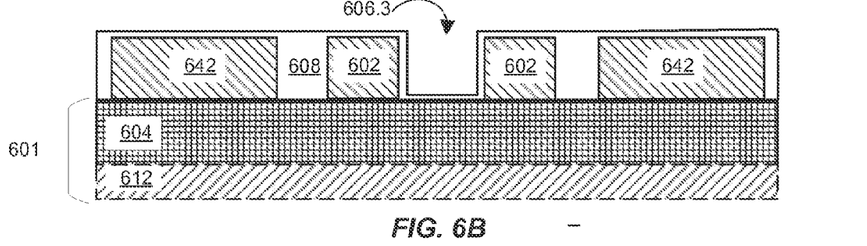

FIG. 6B schematically illustrates a differential-pair-based planar waveguide on a PCB with a single central trench added. Open trench 606.3 reaches from just beyond an inward-facing side one of the conductors 602 to just beyond in inter-facing side of the other conductor 602. This will reduce the loss by about the same amount in each member of the differential pair, maintaining a balance between the two signals.

Figure 6C:
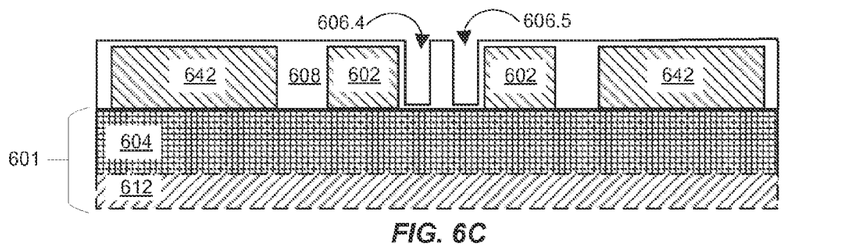

FIG. 6C schematically illustrates a differential-pair-based planar waveguide on a PCB with a pair of central trenches added to the differential pair. Trenches 606.4 and 606.5 closely flank their neighboring conductors 602, but leave some intact dielectric 608 between them.

Figure 6D:
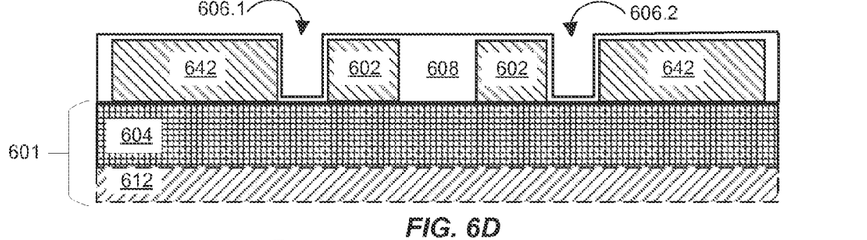

FIG. 6D schematically illustrates a differential-pair-based planar waveguide on a PCB with a pair of outer-edge trenches added to the differential pair. In essence, this differential pair of conductor 602 is flanked by outer trenches just like 606.1 and 606.2 in FIG. 6A. Any of the same options available to a single-trace waveguide may readily adapt to use with the differential pair: Trenches 606.1 and 606.2 may have some other depth between zero and the entire thickness of substrate 601 and surrounding dielectric 608. Another independent alternative is to have one wall of each trench 606.1 and 606.2 close to conductor 602 as illustrated, but narrower so is not to reach all the way to coplanar ground line 642.

Figure 6E:
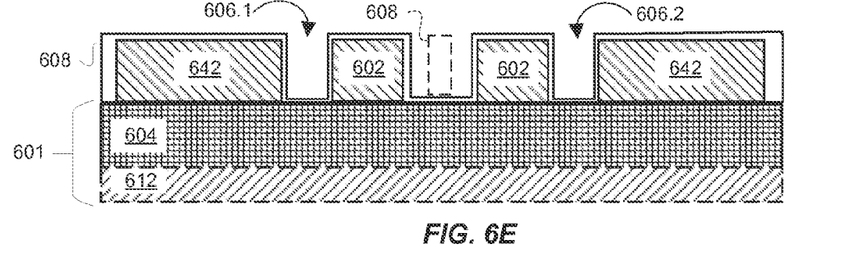

FIG. 6E schematically illustrates a differential-pair-based planar waveguide on a PCB with the combination the trenches from FIG. 6D and the trenches from FIG. 6B or 6C. The combination may provide the greatest dielectric loss reduction among the differential-pair options However, a manufacturing tool may have multiple parallel scribing-laser beams, mechanical blades, mask slits, or other trench-making means so that all the trenches may be made in a single pass. FIG. 6E may include trenches 606.1 and 606.2.

As additional alternatives to the configurations illustrated in FIGS. 1A-1C, 2A-2C, 5A-5E and 6A-6E, there may be other types of signal lines using only a single coplanar ground line 642 along with the signal conductor or differential pair 602.

FIGS. 7A-7D schematically illustrate trench formation on an interconnect layer of a laminate-type circuit after components are installed. While the preceding discussion has centered on forming trenches around conductors immediately after filling the interconnect layer with dielectric, embodiments are also feasible in which the trenches are formed after components are added above the interconnect layer.

Figure 7A:
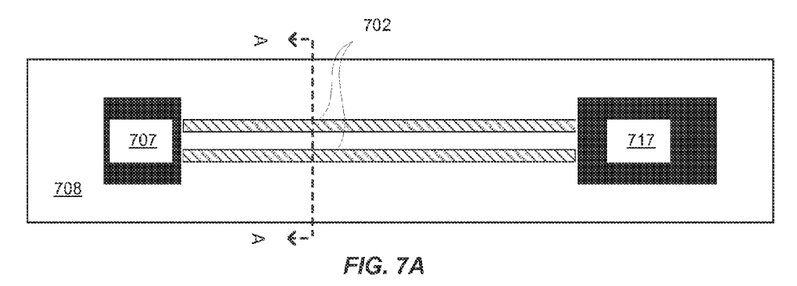
FIGS. 7A-7D schematically illustrate trench formation on an interconnect layer of a laminate-type circuit after components are installed.

FIG. 7A is a top view of the PCB with components installed. Signal conductors 702 are embedded in surrounding dielectric 708; a thin layer of dielectric 708 may optionally cover conductors 702 to protect the conductors 702 from corrosion. First component 707 and second component 717 are communicatively coupled by conductors 702, which are presently trenchless. Conductors 702 may be two single-ended signal traces, a differential pair, two differential pairs, planar waveguides, or any other suitable type of interconnect.

Figure 7B:
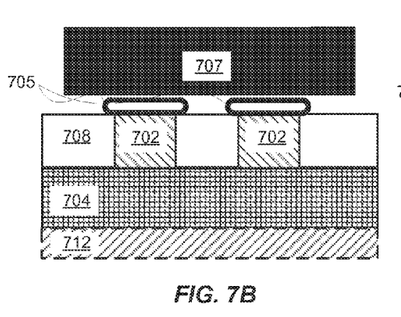
Figure 7C:
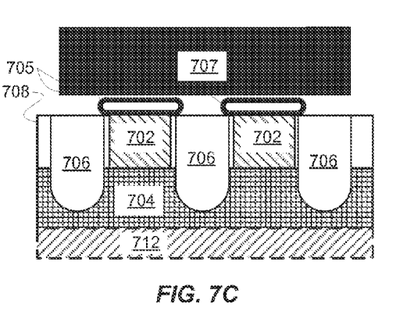

FIGS. 7B and 7C are cross-sectional views through section A-A of FIG. 7A, showing composite layer 704 and optional ground backing layer 712. Component 707 and its mounts 705 are also visible, but do not actually intersect with sectioning line A-A. In FIG. 7B, conductors 702 are still trenchless. In FIG. 7C, trenches 706 have been formed around and between conductors 702. As illustrated, trenches 706 are round-bottomed and extend into composite 704, but any other suitable trench configuration may be used. FIGS. 7B and 7C may include dielectric 708.

Figure 7D:
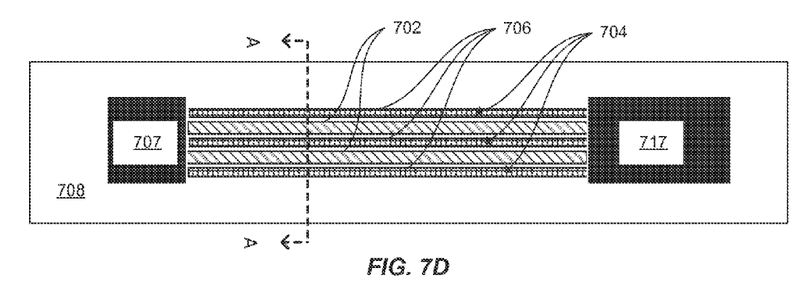

FIG. 7D is a top view corresponding to the cross-section of FIG. 7C, showing the trenches 706 through dielectric 708 and exposing the composite 704 between and around the conductors 702. FIG. 7D may also include first component 707, second component 717, and section A-A FIGS. 8A-8E schematically illustrate trench formation after applying a thick protective overcoating to the interconnect layer and installed components. Some PCBs or other laminate-type circuits may be given a thick protective overcoating after the components are installed. The overcoating may protect the circuit from damage during transport, storage, or operation.

Figure 8A:
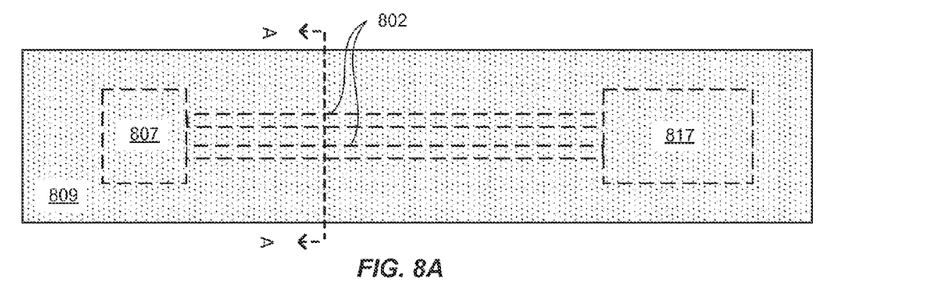
FIGS. 8A-8E schematically illustrate trench formation after applying a thick protective overcoating to the interconnect layer and installed components.

FIG. 8A is a top view of the trenchless overcoated PCB with components installed. Signal conductors 802, first component 807, and second component 817 are buried under overcoating 809. Conductors 802 may be two single-ended signal traces, a differential pair, two differential pairs, planar waveguides, or any other suitable type of interconnect.

Figure 8B:
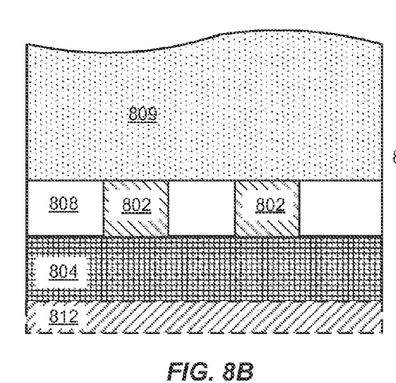
Figure 8C:
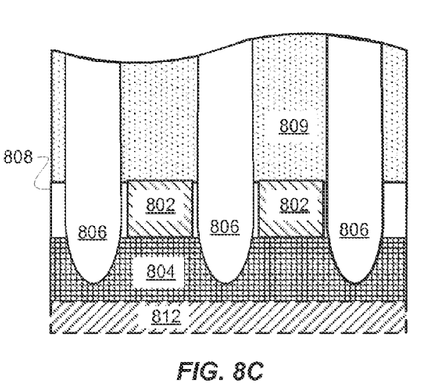

FIGS. 8B and 8C are cross-sectional views through section A-A of FIG. 8A, showing composite layer 804 and optional ground backing layer 812. In FIG. 8B, conductors 802 are still trenchless with dielectric 808 and overcoating 809 that may surround conductors 802. In FIG. 8C, trenches 806 have been formed around and between conductors 802 through overcoating 809 and surrounding dielectric layer 808. As illustrated, trenches 806 are round-bottomed and extend into composite 804, but any other suitable trench configuration may be used.

Figure 8D:
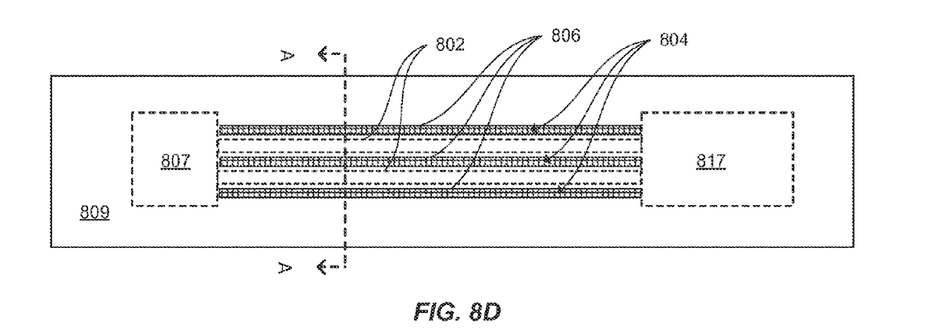

FIG. 8D is a top view corresponding to the cross-section of FIG. 8C, showing the trenches 806 penetrating through overcoating 809 and intervening layers to the composite 804 between and around the conductors 802. FIG. 8D may show first component 807, second component 817, and section A-A.

Figure 8E:
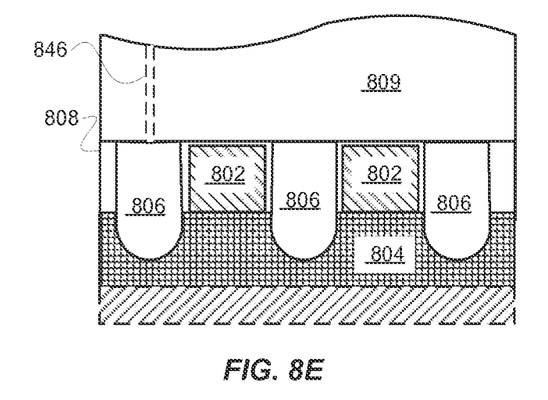

FIG. 8E is a cross-sectional view of an alternative approach to trenches in circuits that use thick protective overcoating. Trenches 806 were fabricated through surrounding dielectric layer 808 and part of composite layer 804 sometime before overcoating 809 was applied. Overcoating 809, when applied, is sufficiently viscous and cohesive that it does not flow into trenches 806, so that air or other ambient medium is trapped inside trenches 806. If the application indicates that the circuit may perform better if the trenches are at equilibrium with the environment outside the circuit, a small vent 846 may be made through overcoating 809. FIG. 8E may include conductors 802.

Figure 9:
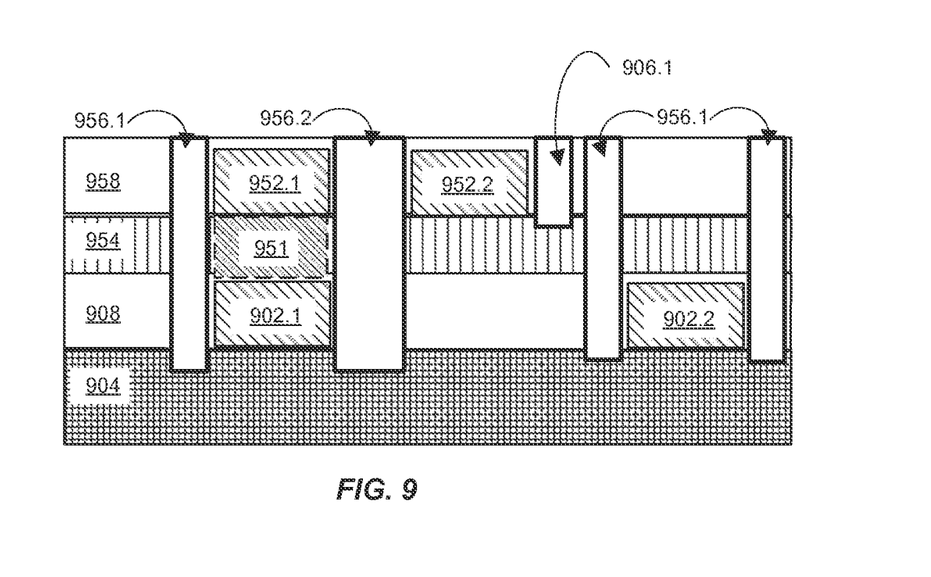
FIG. 9 schematically illustrates an approach to trenches in a double interconnect layer.

FIG. 9 schematically illustrates an approach to trenches in a double interconnect layer. Occasionally, a second interconnect layer is added to a laminate-type circuit (e.g., to meet routing demands in the allotted space).

In FIG. 9, composite layer 904 underlies a lower interconnect layer 908, an ILD layer 954, and an upper interconnect layer 958. Upper interconnect layer 958 includes conductors 952.1 and 952.2. Lower interconnect layer 908 includes conductors 902.1 and 902.2. Optionally, a via 951 may connect upper conductor 952.1 to lower conductor 902.1.

Open trenches may be implemented in the upper layer using the same approaches as for a single interconnect layer. For example, trench 906.1 of FIG. 9 only needs to penetrate upper layer 958 to reduce dielectric loss in conductor 952.2. Conductors crossing under conductor 952.2 on lower level 908 will not be disturbed by the shallow upper trenches.

As for the lower layer, the trenches may extend from a top surface of the circuit down through the lower layer like narrow trenches 956.1 and wide trench 956.2. Where a lower-layer conductor crosses under an upper-layer conductor, the deep trench for the lower-layer conductor can stop on one side of the crossing and re-start on the other side to avoid cutting into the upper-layer conductor.

The proposed approach may be implemented with existing manufacturing equipment and processes. It is potentially a cost-effective alternative to expensive low-dielectric-loss substrates for reducing link loss at high data rates.

EXAMPLES

Example 1 may be a device, comprising: a substrate; a conductor laminated onto the substrate; a first dielectric layer disposed on the top surface and sides of the conductor; a second dielectric layer disposed on the substrate; and a first open trench disposed in a second dielectric layer and filled with a low-loss ambient medium, wherein the first open trench is disposed between the second dielectric layer and the conductor, and wherein the first open trench intersects an electromagnetic field induced in the dielectric layer by a signal traveling in the conductor.

Example 2 may include the device of example 1, further comprising a second open trench disposed in the second dielectric layer on an opposite side of the conductor from the first open trench, wherein the second open trench is filled with the low-loss ambient medium, and wherein the second open trench intersects an envelope of the electromagnetic field induced in the dielectric layer by the signal traveling in the conductor.

Example 3 may include the device of example 1, wherein the first open trench does not contact a conductive material of the conductor.

Example 4 may include the device of example 1, wherein the conductor is a single-ended signal trace.

Example 5 may include the device of example 1, wherein the conductor is a pair of traces carrying a differential signal.

Example 6 may include the device of example 5, further comprising a third open trench disposed in the second dielectric layer between the pair of traces; wherein the third open trench is filled with the low-loss ambient medium, and wherein the third open trench intersects an envelope of the electromagnetic field induced in the second dielectric layer by the signal traveling in the conductor.

Example 7 may include the device of example 1, wherein the conductor comprises a plurality of traces, wherein the conductor has a first impedance, and wherein an actual spacing between the traces is narrower than a calculated spacing predicted to produce the first impedance in a trench-less but otherwise identical conductor.

Example 8 may include the device of example 1, further comprising a first ground line on a first side of the conductor.

Example 9 may include the device of example 8, further comprising a second ground line on a second side of the conductor, wherein the second side of the conductor is opposite the first side of the conductor.

Example 10 may include the device of example 8, wherein the conductor comprises a microstrip or a planar waveguide.

Example 11 may be a printed circuit board, comprising: a first dielectric layer; a conductor adjacent to the first dielectric layer, a portion of the first dielectric layer disposed on a top surface of the conductor, wherein the conductor is disposed in a signal plane on the first dielectric layer; and one or more open trenches adjacent to the conductor on the opposite side of the first dielectric layer, wherein the one or more open trenches are parallel to the conductor, intersect an electromagnetic field induced in the first dielectric layer by a signal traveling in the conductor, and are filled with a low-loss ambient medium.

Example 12 may include the printed circuit board of example 11, wherein the first dielectric layer comprises an epoxy.

Example 13 may include the printed circuit board of example 11, wherein the first dielectric layer comprises resin-impregnated cloth.

Example 14 may include the printed circuit board of example 11, wherein the conductor is plated.

Example 15 may include the printed circuit board of example 11, further comprising a ground backing layer under the first dielectric layer.

Example 16 may be a method, comprising: upon a substrate that has a composite dielectric layer, forming a pair of conductive microstrips on the composite dielectric layer; forming a plurality of trenches adjacent to the conductive microstrips wherein the plurality of trenches extend through the composite dielectric layer; assembling a mount on a top surface of each conductive microstrip; and assembling at least one electrical component on a top surface of the pair of conductive microstrips.

Example 17 may include the method of example 16 further comprising forming a plating layer on a top surface of the pair of conductive microstrips.

Example 18 may include the method of example 16, wherein the plurality of trenches are round-bottomed.

Example 19 may include the method of example 16, wherein the plurality of trenches are formed by at least one of laser ablation, photodisruption, laser cutting, thermal cutting, mechanical displacement, reactive-ion etching, or wet chemical etching.

Example 20 may include the method of example 16, wherein the pair of conductive microstrips are laminated on the composite dielectric layer.

The preceding Description and accompanying Drawings describe examples of embodiments in some detail to aid understanding. However, the scope of protection may also include equivalents, permutations, and combinations that are not explicitly described herein. Only the claims appended here (along with those of parent, child, or divisional patents, if any) define the limits of the protected intellectual-property right.

We claim:

1. A device, comprising:
   a substrate;
   a conductor laminated onto the substrate;
   a first dielectric layer disposed on a top surface and sides of the conductor;
   a second dielectric layer disposed on the substrate; and
   a first open trench disposed in the second dielectric layer and filled with a low-loss ambient medium of nitrogen or argon,
   wherein the first open trench is disposed between the second dielectric layer and the conductor, and
   wherein the first open trench intersects an electromagnetic field induced in the first dielectric layer by a signal traveling in the conductor.

2. The device of claim 1, further comprising a second open trench disposed in the second dielectric layer on an opposite side of the conductor from the first open trench,
   wherein the second open trench is filled with the low-loss ambient medium, and
   wherein the second open trench intersects an envelope of the electromagnetic field induced in the first dielectric layer by the signal traveling in the conductor.

3. The device of claim 1, wherein the first open trench does not contact a conductive material of the conductor.

4. The device of claim 1, wherein the conductor is a single-ended signal trace.

5. The device of claim 1, wherein the conductor is a pair of traces carrying a differential signal.

6. The device of claim 5, further comprising a third open trench disposed in the second dielectric layer between the pair of traces;
   wherein the third open trench is filled with the low-loss ambient medium, and
   wherein the third open trench intersects an envelope of the electromagnetic field induced in the first dielectric layer by the signal traveling in the conductor.

7. The device of claim 1, further comprising a first ground line on a first side of the conductor.

8. The device of claim 7, wherein the conductor comprises a microstrip or a planar waveguide.

9. The device of claim 7, further comprising a second ground line on a second side of the conductor, wherein the second side of the conductor is opposite the first side of the conductor.

10. A printed circuit board, comprising:
    a first dielectric layer;
    a conductor adjacent to the first dielectric layer, a portion of the first dielectric layer disposed on a top surface of the conductor,
    wherein the conductor is disposed in a signal plane on the first dielectric layer; and one or more open trenches adjacent to the conductor on the opposite side of the first dielectric layer, wherein the one or more open trenches are parallel to the conductor, intersect an electromagnetic field induced in the first dielectric layer by a signal traveling in the conductor, and are filled with a low-loss ambient medium of nitrogen or argon.

11. The printed circuit board of claim 10, further comprising a ground backing layer under the first dielectric layer.

12. The printed circuit board of claim 10, wherein the first dielectric layer comprises an epoxy.

13. The printed circuit board of claim 10, wherein the first dielectric layer comprises resin-impregnated cloth.

14. The printed circuit board of claim 10, wherein a plating is applied to the conductor.

15. A method, comprising:
upon a substrate that has a composite dielectric layer,
forming a pair of conductive microstrips on the composite dielectric layer;
forming a plurality of trenches adjacent to the conductive microstrips wherein the plurality of trenches extend through the composite dielectric layer, and wherein the plurality of trenches are filled with nitrogen or argon;
assembling a mount on a top surface of each conductive microstrip; and
assembling at least one electrical component on a top surface of the pair of conductive microstrips.

16. The method of claim 15, wherein the pair of conductive microstrips are laminated on the composite dielectric layer.

17. The method of claim 15, wherein the plurality of trenches are formed by at least one of laser ablation, photodisruption, laser cutting, thermal cutting, mechanical displacement, reactive-ion etching, or wet chemical etching.

18. The method of claim 15, wherein the plurality of trenches are round-bottomed.

* * * * *